(12) United States Patent
Chiu et al.

(10) Patent No.: US 12,261,358 B2
(45) Date of Patent: *Mar. 25, 2025

(54) ANTENNA DEVICE

(71) Applicant: Chicony Electronics Co., Ltd., New Taipei (TW)

(72) Inventors: Chi-Yang Chiu, New Taipei (TW); Jung-Hsiu Lee, New Taipei (TW); Yen-Ching Lee, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/610,193

(22) Filed: Mar. 19, 2024

(65) Prior Publication Data

US 2024/0235015 A1 Jul. 11, 2024

Related U.S. Application Data

(63) Continuation of application No. 17/848,359, filed on Jun. 23, 2022, now Pat. No. 12,003,024.

(30) Foreign Application Priority Data

Aug. 23, 2021 (TW) .................................. 110130994

(51) Int. Cl.
*H01Q 1/42* (2006.01)
*H05K 7/14* (2006.01)

(52) U.S. Cl.
CPC ............. *H01Q 1/42* (2013.01); *H05K 7/1427* (2013.01)

(58) Field of Classification Search
CPC .......... H01Q 1/42; H01Q 1/2275; H01Q 1/36; H01Q 9/30; H01Q 1/2291; H05K 7/1427
See application file for complete search history.

(56) References Cited

U.S. PATENT DOCUMENTS

| | | | | |
|---|---|---|---|---|
| 7,833,056 B1* | 11/2010 | Lee | .................... | H01R 13/6581 439/946 |
| 8,717,240 B2* | 5/2014 | Flores-Cuadras | ........ | H01Q 5/25 343/702 |
| 9,844,149 B2* | 12/2017 | Cariou | ..................... | H01Q 9/42 |
| 2012/0212377 A1* | 8/2012 | He | .......................... | H01Q 9/42 343/702 |
| 2014/0028501 A1* | 1/2014 | Cariou | ................. | H01Q 1/2275 343/700 MS |
| 2015/0123853 A1* | 5/2015 | Wu | ........................ | H01Q 5/371 343/700 MS |

* cited by examiner

*Primary Examiner* — Hai V Tran
*Assistant Examiner* — Michael M Bouizza
(74) *Attorney, Agent, or Firm* — JCIPRNET

(57) ABSTRACT

An antenna device includes a casing, a circuit board, and an antenna. The casing has a positioning structure. The circuit board is disposed in the casing. The antenna is disposed in the casing and includes a main body portion and a connection portion connected to each other. The connection portion is connected to a surface of the circuit board. The main body portion is extended on a plane defined by a first axial direction and a second axial direction. The first axial direction is perpendicular to the surface and the second axial direction is parallel to the surface. The main body portion is positioned on the positioning structure and separated from the circuit board.

8 Claims, 6 Drawing Sheets

ANTENNA DEVICE

CROSS-REFERENCE TO RELATED APPLICATION

This application is a continuation application of and claims the priority benefit of a prior application Ser. No. 17/848,359, filed on Jun. 23, 2022, which claims the priority benefit of Taiwanese application Ser. No. 11/013,0994, filed on Aug. 23, 2021. The entirety of each of the above-mentioned patent applications is hereby incorporated by reference herein and made a part of this specification.

BACKGROUND

Technical Field

The disclosure relates to an electronic device. In particular, the disclosure relates to an antenna device.

Description of Related Art

With the advance and development of wireless transmission hardware equipment and technology, signal reception and transmission between different electronic devices has gradually progressed from wired transmission to wireless transmission.

In terms of computers, users may perform wireless signal transmission with external devices through a Bluetooth dongle or other forms of antenna devices plugged into connection ports of the computer. Antennas in most of the antenna devices currently on the market are planar antennas formed on a surface of a circuit board. Since the antenna extended in the horizontal direction increases a dimension of the antenna device in the horizontal direction, when the antenna device is plugged into the computer, the exposed part of the antenna device outside the computer has a relatively great protruding length. To address this issue and improve the signal transmission and reception efficiency of antennas, antennas in some antenna devices are configured as a three-dimensional antenna, which are extended on a plane perpendicular to the circuit board. However, to fix the three-dimensional antenna, a hook structure is required to be extended from the circuit board to be engaged with the three-dimensional antenna. This requires additional planning of a space for accommodating the hook structure inside the antenna device, and may still increases the dimension of the antenna device in the horizontal direction. In addition, since the three-dimensional antenna is required to be matched with the hook structure of the circuit board, the shape of the antenna is limited, adversely affecting the signal transmission and reception efficiency of the antenna. Moreover, the three-dimensional antenna is required to have sufficient elastic deformability to be successfully engaged with the circuit board, which limits the selectable materials of the antenna, adversely affecting the improvement of the signal transmission and reception efficiency of the antenna.

SUMMARY

The disclosure provides an antenna device which has a relatively small protruding length when plugged into an electronic device and is efficient in signal transmission and reception.

The antenna device of the disclosure includes a casing, a circuit board, and an antenna. The casing has a positioning structure. The circuit board is disposed in the casing. The antenna is disposed in the casing and includes a main body portion and a connection portion connected to each other. The connection portion is connected to a surface of the circuit board. The main body portion is extended on a plane defined by a first axial direction and a second axial direction. The first axial direction is perpendicular to the surface. The second axial direction is parallel to the surface. The main body portion is positioned on the positioning structure and separated from the circuit board.

In an embodiment of the disclosure, the positioning structure includes a plurality of rib portions. At least part of the main body portion is positioned between the rib portions.

In an embodiment of the disclosure, the connection portion is extended toward the circuit board along a third axial direction. The third axial direction is perpendicular to the first axial direction and the second axial direction. The antenna is in contact with the circuit board by the connection portion alone.

In an embodiment of the disclosure, the casing includes an insulating case and a metal case. The circuit board and the antenna are disposed in the insulating case. The metal case is assembled to the insulating case and covers at least part of the circuit board. The positioning structure is formed on the insulating case.

In an embodiment of the disclosure, the insulating case has a first accommodating space and a second accommodating space adjacent to each other. The first accommodating space accommodates the circuit board. The second accommodating space accommodates the antenna. The circuit board is completely located outside the second accommodating space.

In an embodiment of the disclosure, the insulating case has a plug portion and an exposed portion connected to each other. At least part of the circuit board is disposed in the plug portion. The antenna is disposed in the exposed portion. The exposed portion is exposed outside an electronic device when the plug portion is plugged into the electronic device.

In an embodiment of the disclosure, the plug portion is adapted for being plugged into the electronic device along a third axial direction. The third axial direction is perpendicular to the first axial direction and the second axial direction. A dimension of the exposed portion in the third axial direction is less than 3.5 mm.

In an embodiment of the disclosure, the insulating case includes a bottom base and a cover. The circuit board and the antenna are disposed on the bottom base. The cover is connected to the bottom base and covers at least part of the antenna.

In an embodiment of the disclosure, the main body portion includes a plurality of segments. The segments are sequentially connected to one another in a bent manner.

In an embodiment of the disclosure, some of the segments are extended along the first axial direction, and the remaining of the segments are extended along the second axial direction.

Based on the foregoing, in the antenna device according to the embodiments of the disclosure, since the three-dimensional antenna is fixed by the positioning structure of the casing, it is not required to extend a hook structure to be engaged with the antenna from the circuit board. Therefore, it is not required to additionally plan a space for accommodating the hook structure in the casing, so the dimension of the casing can be reduced, and the antenna device accordingly has a relatively small protruding length when plugged into the electronic device. In addition, since the antenna is fixed by the positioning structure of the casing instead of being engaged with the hook structure of the circuit board, the shape of the antenna is not limited by the requirement to be matched with the hook structure, and the selectable materials of the antenna are not limited by the elastic deformability required for engagement and assembly. Accordingly, the antenna has a high degree of design freedom and can be efficient in signal transmission and reception.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3 is a perspective view illustrating the antenna device of FIG. 1 being seen through.

DESCRIPTION OF THE EMBODIMENTS

Figure 1:
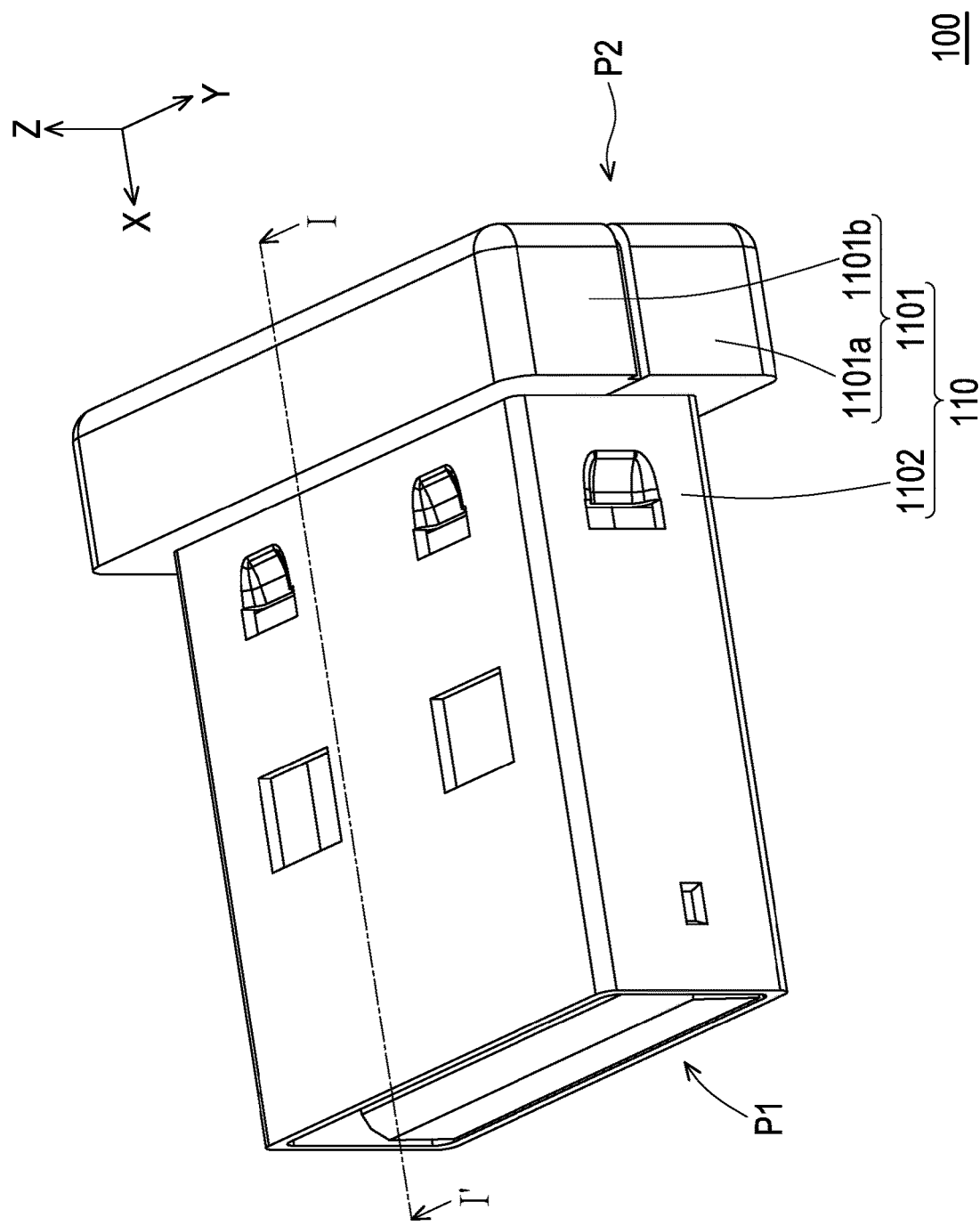
FIG. 1 is a perspective view of an antenna device according to an embodiment of the disclosure.
Figure 2:
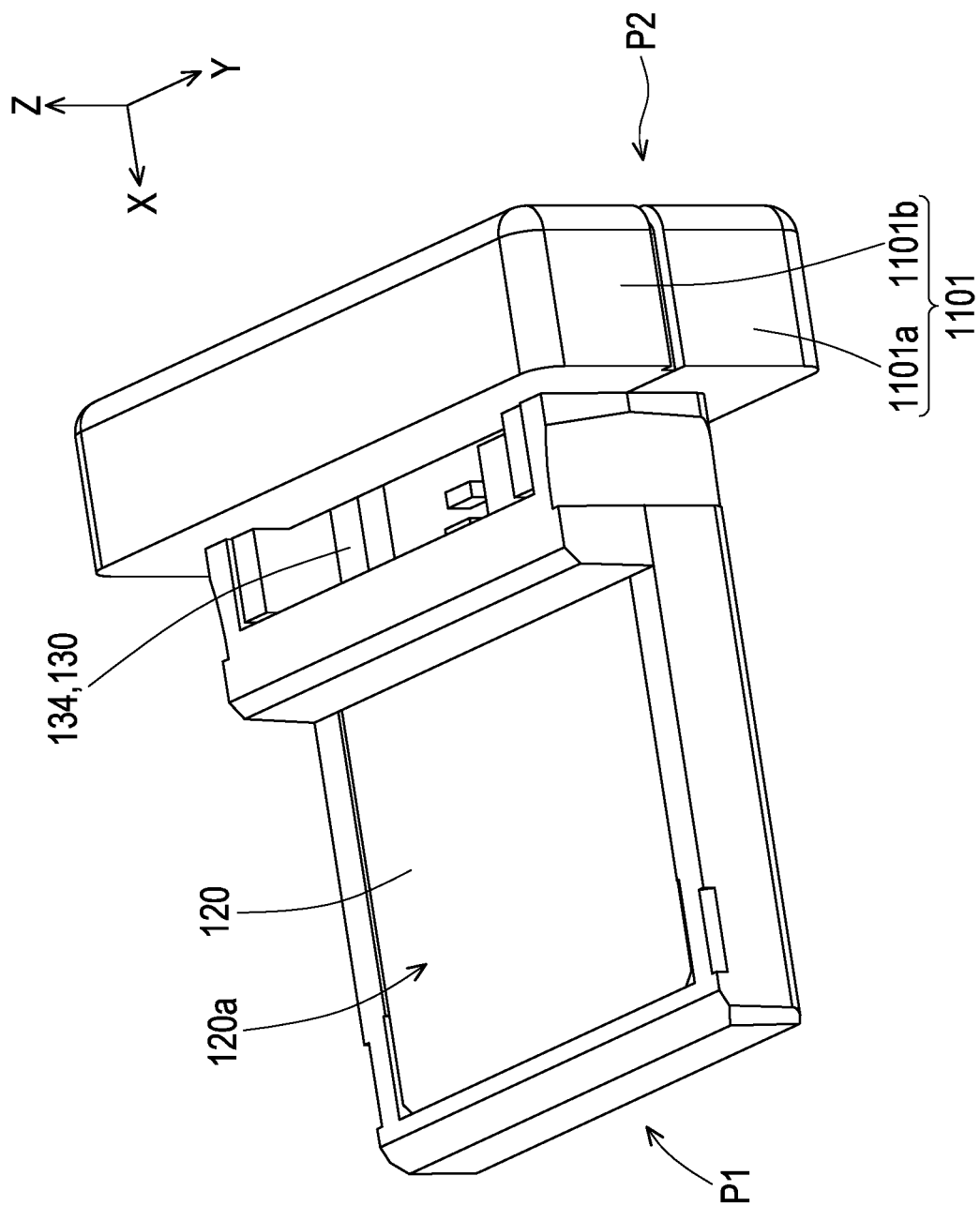
FIG. 2 is a perspective view of some members of the antenna device of FIG. 1.
Figure 3:
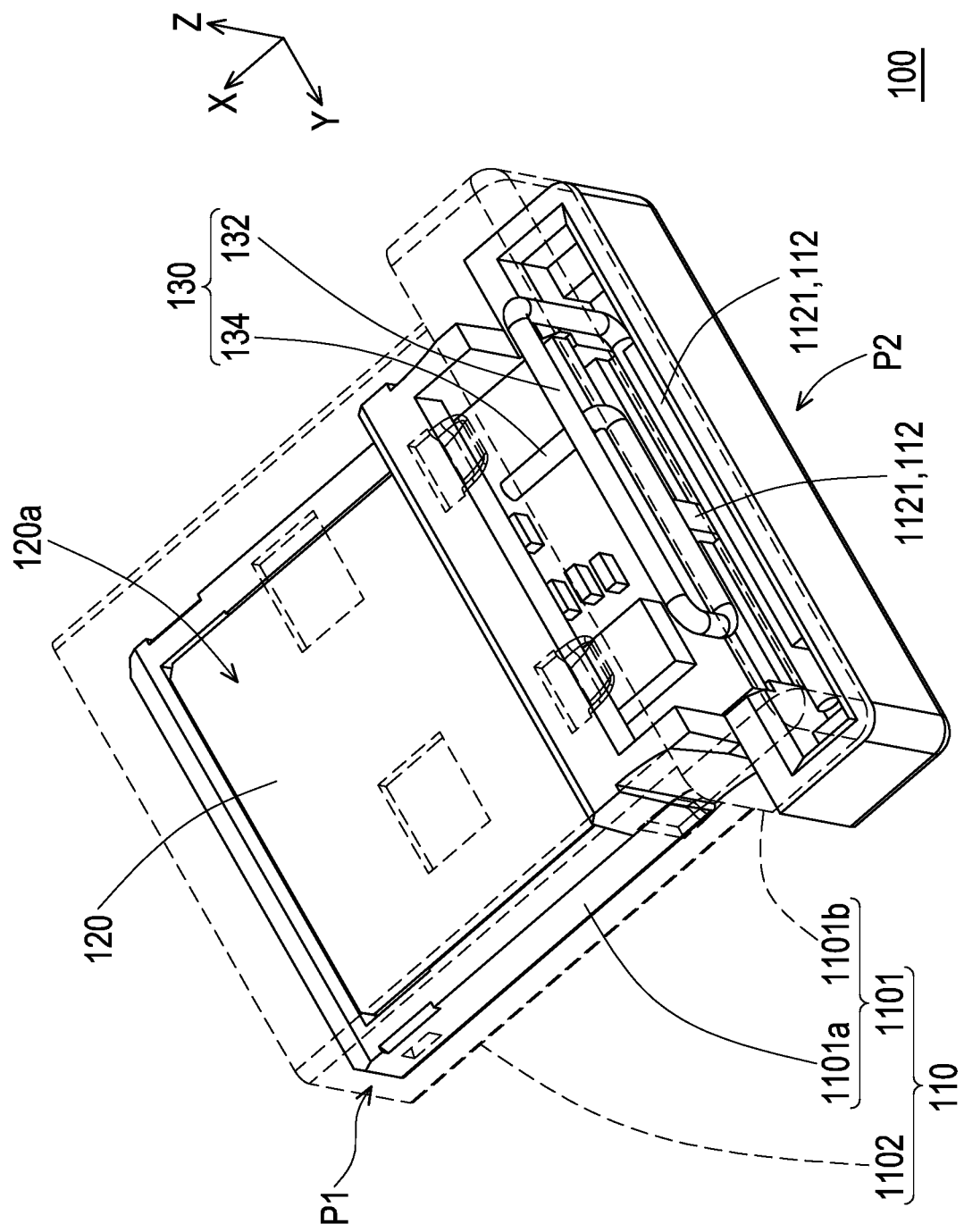

FIG. 1 is a perspective view of an antenna device according to an embodiment of the disclosure. FIG. 2 is a perspective view of some members of the antenna device of FIG. 1. FIG. 3 is a perspective view illustrating the antenna device of FIG. 1 being seen through. With reference to FIG. 1 to FIG. 3, an antenna device 100 of this embodiment includes a casing 110, a circuit board 120, and an antenna 130. The circuit board 120 and the antenna 130 are disposed in the casing 110. The antenna 130 includes a main body portion 132 and a connection portion 134 connected to each other. The main body portion 132 is extended on a virtual plane defined by a first axial direction Z and a second axial direction Y and is a three-dimensional antenna. The connection portion 134 is extended toward the circuit board 120 along a third axial direction X and is connected to a surface 120a of the circuit board 120. The first axial direction Z is perpendicular to the surface 120a of the circuit board 120, the second axial direction Y is parallel to the surface 120a of the circuit board 120, and the third axial direction X is perpendicular to the first axial direction Z and the second axial direction Y. The antenna device 100 of this embodiment may be a Bluetooth dongle or other forms of wireless transceivers, which is not limited by the disclosure.

Figure 4:
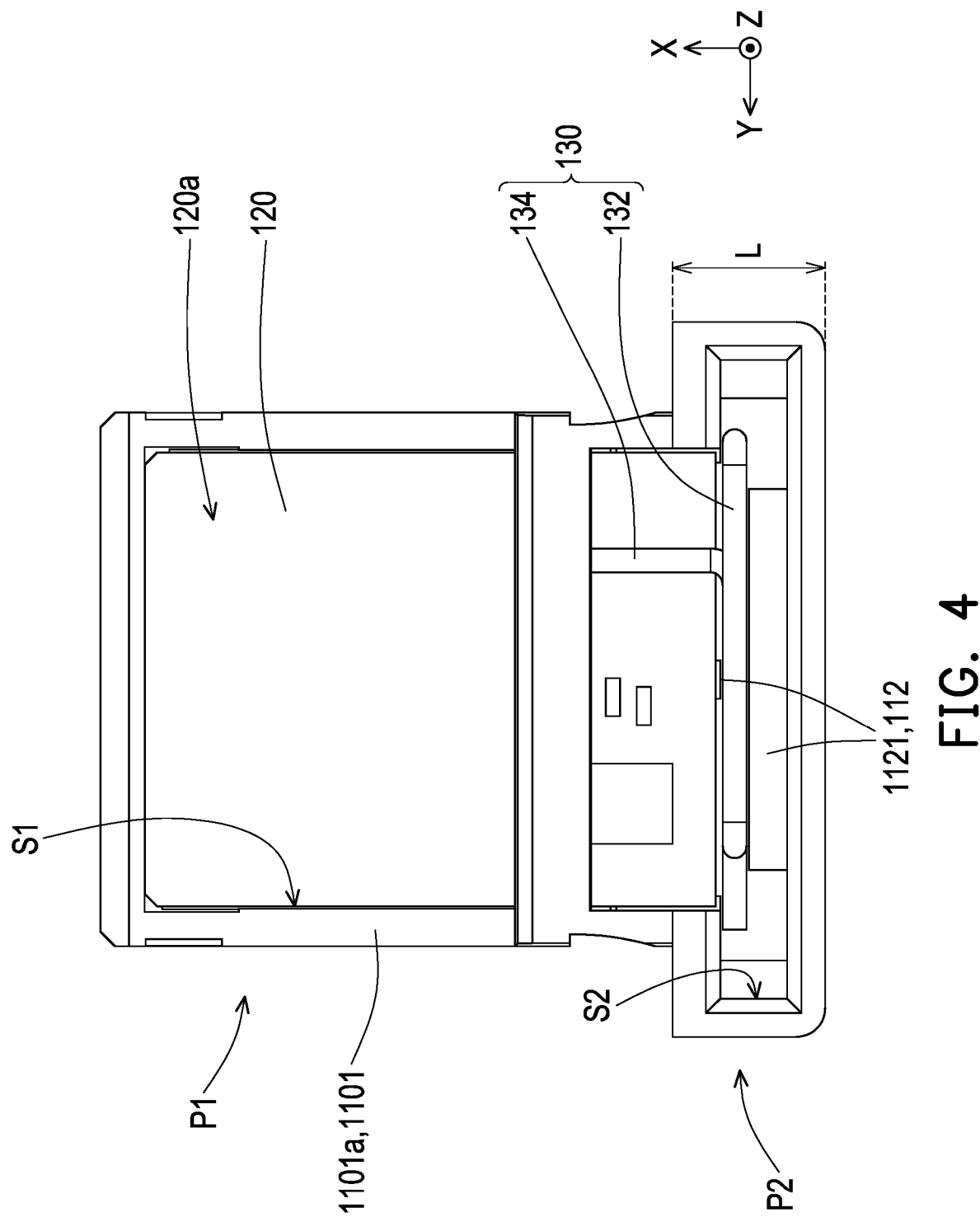
FIG. 4 is a top view of some members of the antenna device of FIG. 1.
Figure 5:
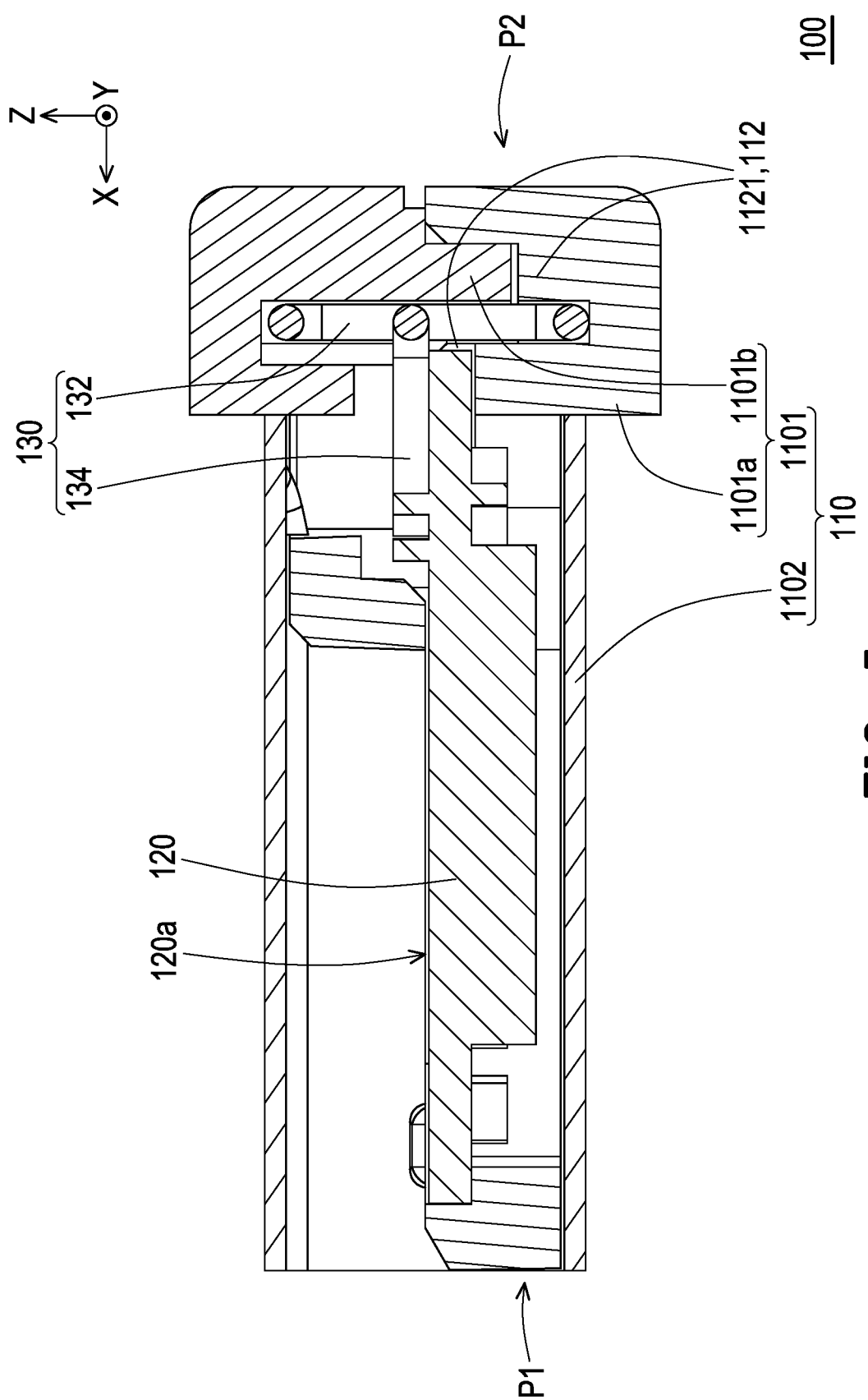
FIG. 5 is a cross-sectional view of the antenna device of FIG. 1.

FIG. 4 is a top view of some members of the antenna device of FIG. 1. FIG. 5 is a cross-sectional view of the antenna device of FIG. 1, and corresponds to line I-I' of FIG. 1. With reference to FIG. 3 to FIG. 5, the casing 110 of this embodiment has a positioning structure 112. The main body portion 132 of the antenna 130 is positioned on the positioning structure 112 and separated from the circuit board 120. In other words, the main body portion 132 of the antenna 130 is not in contact with the circuit board 120. In this embodiment, the antenna 130 is in contact with the circuit board 120 by the connection portion 134 alone. The connection portion 134 of the antenna 130 is connected to the surface 120a of the circuit board 120 by welding, for example. In other embodiments, metal domes or pogo pins may be disposed on the surface 120a of the circuit board 120 to be in contact with the connection portion 134 of the antenna 130.

Since the antenna 130 is fixed by the positioning structure 112 of the casing 110 as described above, it is not required to extend a hook structure to be engaged with the antenna 130 from the circuit board 120. Therefore, it is not required to additionally plan a space for accommodating the hook structure in the casing 110, so a dimension of the casing 110 can be reduced. Accordingly, the antenna device 100 has a relatively small protruding length when plugged into an electronic device (e.g., a notebook computer or other types of electronic devices). In addition, since the antenna 130 is fixed by the positioning structure 112 of the casing 110 as described above instead of being engaged with the hook structure of the circuit board, the shape of the antenna 130 is not limited by the requirement to be matched with the hook structure, and the selectable materials of the antenna 130 are not limited by the elastic deformability required for engagement and assembly. Accordingly, the antenna 130 has a high degree of design freedom and can be efficient in signal transmission and reception.

In this embodiment, the positioning structure 112 of the casing 110 includes a plurality of rib portions 1121. Part of the main body portion 132 of the antenna 130 is positioned between the rib portions 1121 at least in the third axial direction X. In the disclosure, the number, the dimension, and the location of the rib portions 1121 are not limited. In some embodiments, the rib portions may further position the main body portion 132 in the second axial direction Y. In addition, in other embodiments, the positioning structure 112 may have other suitable shapes different from those of the rib portions, which is not limited by the disclosure.

The casing 110 of this embodiment includes an insulating case 1101 and a metal case 1102. The insulating case 1101 includes a bottom base 1101a and a cover 1101b. The circuit board 120 and the antenna 130 are disposed on the bottom base 1101a. The cover 1101b is connected to the bottom base 1101a and covers at least part of the antenna 130. The cover 1101b is connected to the bottom base 1101a by glue dispensing or ultrasonic welding, for example.

Further, the insulating case 1101 may be divided into a plug portion P1 and an exposed portion P2 connected to each other. The exposed portion P2 is equivalent to the antenna clearance area of the antenna device 100. Inside the insulating case 1101 is a first accommodating space S1 (labeled in FIG. 4) corresponding to the plug portion P1 and a second accommodating space S2 (labeled in FIG. 4) corresponding to the exposed portion P2. The positioning structure 112 is formed on the bottom base 1101a of the insulating case 1101 and is located in the second accommodating space S2 at the exposed portion P2. At least part of the circuit board 120 is disposed on the bottom base 1101a of the insulating case 1101 and is accommodated by the first accommodating space S1 at the plug portion P1, and the circuit board 120 is completely located outside the second accommodating space S2. The main body portion 132 of the antenna 130 is disposed on the bottom base 1101a of the insulating case 1101 and is accommodated by the second accommodating space S2 at the exposed portion P2. The connection portion 134 of the antenna 130 is extended from the second accommodating space S2 to the first accommodating space S1 and is connected to the surface 120a of the circuit board 120. The metal case 1102 is assembled to the bottom base 1101a of the insulating case 1101 and corresponds to the plug portion P1, and the metal case 1102 covers at least part of the circuit board 120.

The metal case 1102 and the plug portion P1 are adapted for being plugged into the electronic device along the third axial direction X. When the metal case 1102 and the plug portion P1 are plugged into the electronic device, the exposed portion P2 is exposed outside the electronic device. Since it is not required to extend the hook structure to be engaged with the antenna 130 from the circuit board 120 as described above, a dimension L (labeled in FIG. 4) of the exposed portion P2 in the third axial direction X can be reduced to less than 3.5 mm, for example.

Figure 7:
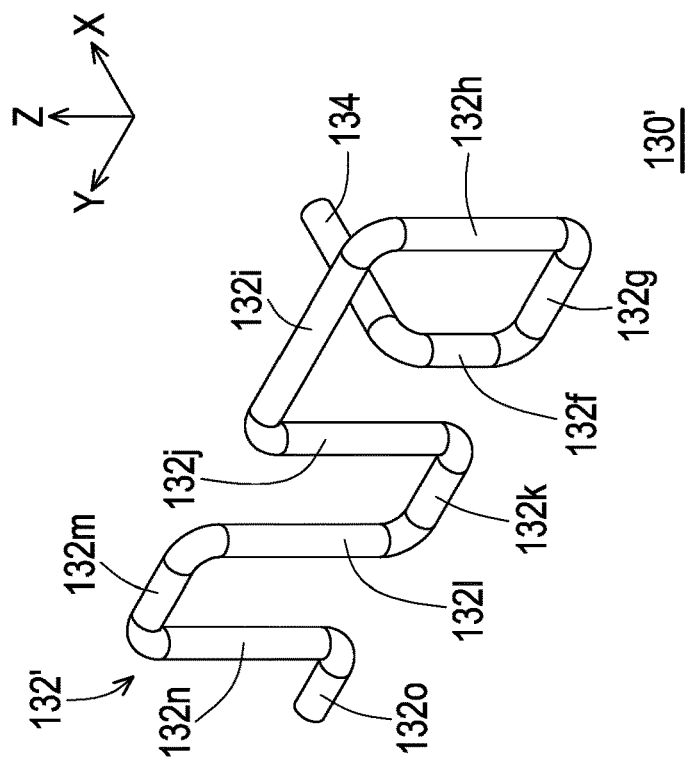
FIG. 7 is a perspective view of an antenna according to another embodiment of the disclosure.
Figure 6:
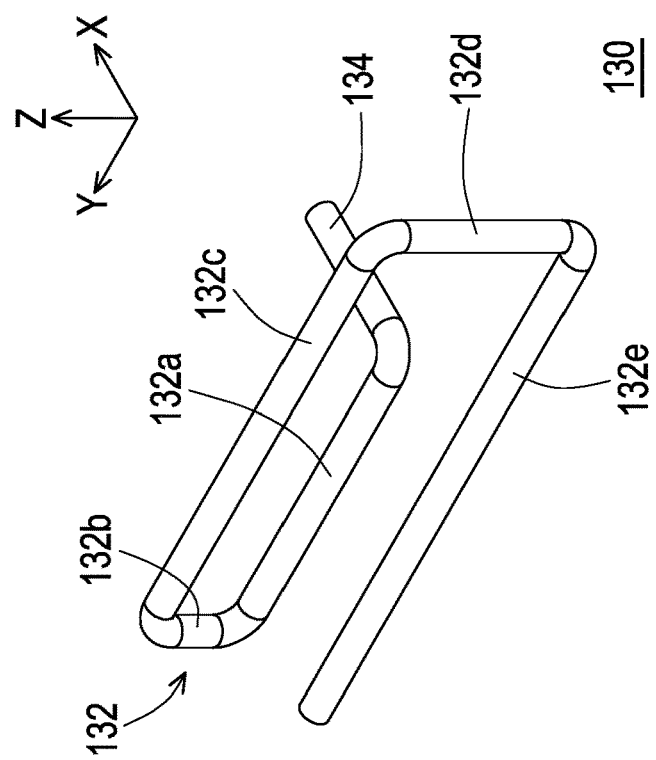
FIG. 6 is a perspective view of the antenna of FIG. 1.

FIG. 6 is a perspective view of the antenna of FIG. 1. With reference to FIG. 6, the antenna 130 of this embodiment is a wound iron antenna, for example, and the main body portion 132 thereof includes a plurality of segments 132a to 132e sequentially connected to one another in a bent manner. The segments 132a, 132c, and 132e are extended along the second axial direction Y, and the segments 132b and 132d are extended along the first axial direction Z. FIG. 7 is a perspective view of an antenna according to another embodiment of the disclosure. As shown in FIG. 7, an antenna 130' may also be a meander-line iron antenna, and an main body portion 132' thereof includes a plurality of segments 132f to 132o sequentially connected to one another in a bent manner. The segments 132g, 132i, 132k, 132m, and 132o are extended along the second axial direction Y, and the segments 132f, 132h, 132j, 132l, and 132n are extended along the first axial direction Z. In other embodiments, the antenna may be in other suitable bent forms, which is not limited by the disclosure.

Assembly of the antenna device of the embodiments above is described below. First, as shown in FIG. 4, the circuit board 120 and the antenna 130 are sequentially placed onto the bottom base 1101a of the insulating case 1101 to position the main body portion 132 of the antenna 130 by the positioning structure 112 and connect the connection portion 134 of the antenna 130 to the surface 120a of the circuit board 120. Next, as shown in FIG. 2, the cover 1101b is connected to the bottom base 1101a. Moreover, as shown in FIG. 1 and FIG. 5, the metal case 1102 is assembled to the bottom base 1101a to complete the assembly of the antenna device 100.

In summary of the foregoing, in the antenna device according to the embodiments of the disclosure, since the three-dimensional antenna is fixed by the positioning structure of the casing, it is not required to extend a hook structure to be engaged with the antenna from the circuit board. Therefore, since it is not required to additionally plan a space for accommodating the hook structure in the casing, the dimension of the casing can be reduced, and the antenna device accordingly has a relatively small protruding length when plugged into the electronic device. In addition, since the antenna is fixed by the positioning structure of the casing instead of being engaged with the hook structure of the circuit board, the shape of the antenna is not limited by the requirement to be matched with the hook structure, and the selectable materials of the antenna are not limited by the elastic deformability required for engagement and assembly. Accordingly, the antenna has a high degree of design freedom and can be efficient in signal transmission and reception.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An antenna device comprising:
a casing having a positioning structure, the casing is adapted for being plugged along a third axial direction;
a circuit board disposed in the casing; and
an antenna disposed in the casing and comprising a main body portion and a connection portion connected to each other, wherein the connection portion is connected to a surface of the circuit board, the main body portion is extended on a plane defined by a first axial direction and a second axial direction, the first axial direction is perpendicular to the third axial direction, the second axial direction is perpendicular to the third axial direction, and the main body portion is positioned on the positioning structure and separated from the circuit board,
wherein the casing comprises an insulating case and a metal case, the circuit board and the antenna are disposed in the insulating case, the metal case is assembled to the insulating case, and the positioning structure is formed on the insulating case,
wherein the insulating case has a first accommodating space and a second accommodating space adjacent to each other, the first accommodating space accommodates the circuit board, the second accommodating space accommodates the antenna, and the circuit board is completely located outside the second accommodating space.

2. The antenna device of claim 1, wherein the positioning structure comprises a plurality of rib portions, and at least part of the main body portion is positioned between the rib portions.

3. The antenna device of claim 1, wherein the connection portion is extended toward the circuit board along the third axial direction, the third axial direction is perpendicular to the first axial direction and the second axial direction, and the antenna is in contact with the circuit board by the connection portion alone.

4. The antenna device of claim 1, wherein the insulating case has a plug portion and an exposed portion connected to each other, the antenna is disposed in the exposed portion, and the exposed portion is exposed outside an electronic device when the plug portion is plugged into the electronic device.

5. The antenna device of claim 4, wherein the plug portion is adapted for being plugged into the electronic device along the third axial direction, the third axial direction is perpendicular to the first axial direction and the second axial direction, and a dimension of the exposed portion in the third axial direction is less than 3.5 mm.

6. The antenna device of claim 1, wherein the insulating case comprises a bottom base and a cover, the circuit board and the antenna are disposed on the bottom base, and the cover is connected to the bottom base and covers at least part of the antenna.

7. The antenna device of claim 1, wherein the main body portion comprises a plurality of segments, and the segments are sequentially connected to one another in a bent manner.

8. The antenna device of claim 7, wherein some of the segments are extended along the first axial direction, and the remaining of the segments are extended along the second axial direction.

* * * * *